(12) United States Patent
Park et al.

(10) Patent No.: US 9,351,417 B2
(45) Date of Patent: May 24, 2016

(54) DISPLAY DEVICE AND METHOD OF MANUFACTURING THE SAME

(71) Applicant: Samsung Display Co., Ltd., Yongin, Gyeonggi-do (KR)

(72) Inventors: Kyung-Jun Park, Yongin-si (KR); Won Il Lee, Cheonan-si (KR)

(73) Assignee: Samsung Display Co., Ltd., Samsung-ro, Giheung-Gu, Yongin-si, Gyeonggi-Do (KR)

( * ) Notice: Subject to any disclaimer, the term of this patent is extended or adjusted under 35 U.S.C. 154(b) by 529 days.

(21) Appl. No.: 13/763,849

(22) Filed: Feb. 11, 2013

(65) Prior Publication Data

US 2014/0078692 A1 Mar. 20, 2014

(30) Foreign Application Priority Data

Sep. 19, 2012 (KR) ................. 10-2012-0104056

(51) Int. Cl.
| | |
|---|---|
| H05K 1/00 | (2006.01) |
| H05K 7/02 | (2006.01) |
| H05K 13/00 | (2006.01) |
| G02F 1/1333 | (2006.01) |
| G02F 1/1345 | (2006.01) |
| H05K 1/02 | (2006.01) |
| G06F 1/16 | (2006.01) |
| H05K 5/00 | (2006.01) |
| H05K 7/00 | (2006.01) |
| H05K 1/18 | (2006.01) |
| H05K 3/00 | (2006.01) |

(52) U.S. Cl.
CPC .............. *H05K 7/02* (2013.01); *G02F 1/1345* (2013.01); *G02F 1/133308* (2013.01); *H05K 1/028* (2013.01); *H05K 1/0278* (2013.01); *H05K 1/0281* (2013.01); *H05K 13/00* (2013.01); *H05K 1/188* (2013.01); *H05K 3/0058* (2013.01); *H05K 2201/10128* (2013.01); *Y10T 29/49117* (2015.01)

(58) Field of Classification Search
CPC .............. G02F 1/1345; G02F 1/13452; G02F 1/133308; H05K 1/028; H05K 1/0278; H05K 1/0281
USPC .......... 361/749, 679.21, 679.27, 679.28, 789; 349/58, 150, 151, 152
See application file for complete search history.

(56) References Cited

U.S. PATENT DOCUMENTS

| | | | | |
|---|---|---|---|---|
| 6,359,390 | B1 * | 3/2002 | Nagai | G02F 1/133308 315/169.1 |
| 8,053,988 | B2 * | 11/2011 | Kim | H05K 7/1461 313/585 |

FOREIGN PATENT DOCUMENTS

| | | |
|---|---|---|
| KR | 1020060016529 A | 2/2006 |
| KR | 1020090061459 A | 6/2009 |
| KR | 1020090073881 A | 7/2009 |

* cited by examiner

*Primary Examiner* — Hoa C Nguyen
*Assistant Examiner* — Binh Tran
(74) *Attorney, Agent, or Firm* — Robert E. Bushnell, Esq.

(57) ABSTRACT

Provided are a display device and a method of manufacturing the same. The display device includes a display panel having one surface and the other surface, a main drive board formed on the other surface of the display panel, a flexible circuit board having one end electrically connected to the one surface of the display panel and the other end electrically connected to the main drive board and having a bent portion formed at a lateral surface of the display panel, and a board support portion formed on an inner surface of the flexible circuit board.

9 Claims, 9 Drawing Sheets

DISPLAY DEVICE AND METHOD OF MANUFACTURING THE SAME

CLAIM OF PRIORITY

This application makes reference to, incorporates the same herein, and claims all benefits accruing under 35 U.S.C. §119 from an application earlier filed in the Korean Intellectual Property Office on Sep. 19, 2012 and there duly assigned Serial No. 10-2012-0104056.

BACKGROUND OF THE INVENTION

1. Field of the Invention

Embodiments of the present invention generally relate to a display device and a method of manufacturing the same, and more particular, to a display device including a flexible circuit board with improved reliability and a method of manufacturing the same.

2. Description of the Related Art

Currently, according to advances in display technology, display devices are widely used in portable display devices, such as notebook computers, mobile phones or portable media players (PMPs) as well as home display devices such as TV sets and monitors. With the trend toward the lighter and slimmer display devices, growing attention is focused on a liquid crystal display (LCD) device, an organic electroluminescent display (OELD) device, and so on.

In various display devices, including the LCD or the OELD, a flexible circuit board is used as means to be electrically connected to a display panel.

The flexible circuit board is easily bendable, compared to a rigid printed circuit board. In the flexible circuit board, a wire pattern is formed on one or both surfaces of a flexibly bendable base film, which can be advantageously used in a space where a general inflexible printed circuit board cannot be installed.

The flexible circuit board is generally used in a bent state to provide an electrical connection between a display panel and a circuit board to apply a particular signal to the display panel. Here, since no separate member for supporting the bent portion of the flexible circuit board exists in the flexible circuit board, the flexible circuit board may be deformed. In addition, damages may be caused to the flexible circuit board due to friction between the flexible circuit board and the display panel.

SUMMARY OF THE INVENTION

Embodiments of the present invention provide a display device, which has improved reliability by preventing deformation of a flexible circuit board, preventing interference and friction between a display panel and a flexible circuit board, and preventing the flexible circuit board from getting loose.

Embodiments of the present invention also provide a method of manufacturing a display device, which has improved reliability by preventing deformation of a flexible circuit board.

The above and other objects of the present invention will be described in or be apparent from the following description of the preferred embodiments.

According to an aspect of the present invention, there is provided a display device including a display panel having one surface and the other surface, a main drive board formed on the other surface of the display panel, a flexible circuit board having one end electrically connected to the one surface of the display panel and the other end electrically connected to the main drive board and having a bent portion formed at a lateral surface of the display panel, and a board support portion formed on an inner surface of the flexible circuit board.

According to another aspect of the present invention, there is provided a method of manufacturing a display device, the method including forming a bent portion by bending a flexible circuit board, adhering one and the other ends of a support member to one and the other sides of the bent portion, forming a board support portion by processing the support member, and electrically connecting the flexible circuit board to a display panel and a main drive board.

According to still another aspect of the present invention, there is provided a method of manufacturing a display device, the method including forming a board support portion by processing a support member, adhering one end of the board support portion to one side of a flexible circuit board, adhering the other end of the board support portion to the other side of the flexible circuit board, and electrically connecting the flexible circuit board to a display panel and a main drive board.

Embodiments of the present invention provide at least the following effects.

In the display device according to embodiments of the present invention, since deformation of the flexible circuit board can be prevented and damages occurring to the flexible circuit board can also be prevented, the reliability and durability of the display device can be improved.

In addition, since stress of the flexible circuit board connected to the display panel is released, a possibility of damages occurring to damages of the flexible circuit board can be reduced, thereby improving the reliability and durability of the display device.

Further, since the flexible circuit board can be prevented from getting loose, the display device having improved reliability and durability can be provided.

BRIEF DESCRIPTION OF THE DRAWINGS

The above and other features and advantages of the present invention will become more apparent by describing in detail preferred embodiments thereof with reference to the attached drawings in which.

DETAILED DESCRIPTION OF THE INVENTION

Advantages and features of the present invention and methods of accomplishing the same may be understood more readily by reference to the following detailed description of preferred embodiments and the accompanying drawings. The present invention may, however, be embodied in many different forms and should not be construed as being limited to the embodiments set forth herein. Rather, these embodiments are provided so that this disclosure will be thorough and complete and will fully convey the concept of the invention to those skilled in the art, and the present invention will only be defined by the appended claims.

It will be understood that when an element or layer is referred to as being "on" another element or layer, it can be directly on the other element or layer or intervening elements or layers may be present. Like numbers refer to like elements throughout.

It will be understood that, although the terms first, second, etc. may be used herein to describe various elements, these elements should not be limited by these terms. These terms are only used to distinguish one element from another element. Thus, for example, a first element, a first component or a first section discussed below could be termed a second element, a second component or a second section without departing from the teachings of the present invention.

Hereinafter, embodiments of the present invention will be described with reference to the accompanying drawings. The following description will be made with regard to a case where a display panel of the present invention is applied to a liquid crystal display device, but aspects of the present invention are not limited thereto. The present invention can also be applied to other types of display devices, such as an organic light emitting diode display (OLED) device or a plasma display panel (PDP).

Figure 1:
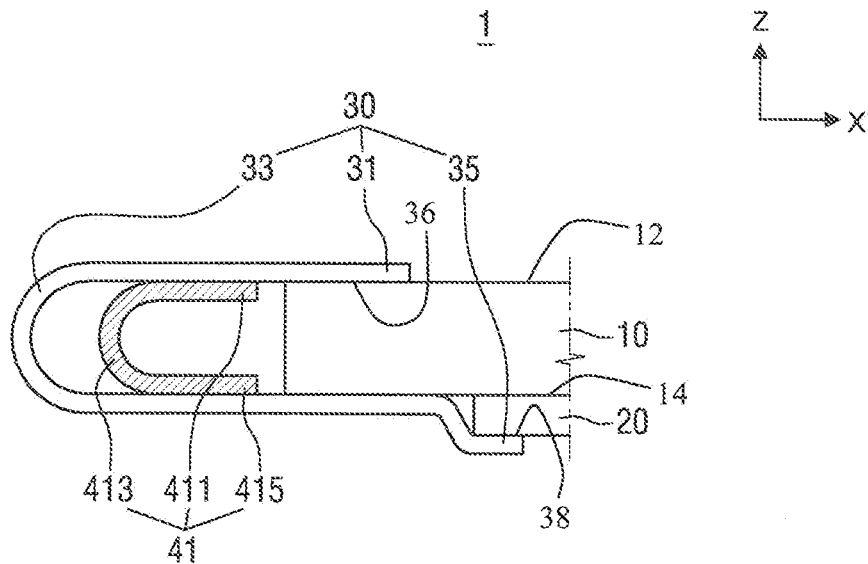
FIG. 1 is a cross-sectional view of a display device according to an embodiment of the present invention.

FIG. 1 is a cross-sectional view of a display device constructed according to an embodiment of the present invention.

Referring to FIG. 1, the display device 1 includes a display panel 10, a main drive board 20, a flexible circuit board 30 and a board support portion 41.

The display panel 10 displays an image and may be one of a liquid crystal display (LCD) panel, an electrophoretic display panel, an organic light emitting diode (OLED) panel, an LED panel, an inorganic electroluminescent (EL) panel, a field emission display (FED) panel, a surface-conduction electron-emitter display (SED) panel, a plasma display panel (PDP), and a cathode ray tube (CRT)) display panel, which are, however, provided only for purpose of illustration. In addition to these panels, all kinds of display panels that are presently developed and commercially available or can be implemented in the future according to technological advances can be used as the display panel 10.

The main drive board 20 is a circuit board for supplying drive signals to the display panel 10. The main drive board 20 may include a timing controller (not shown) for generating a control signal to drive the display panel 10, and a power supply voltage generator (not shown) for generating a power supply voltage.

The main drive board 20 may be mounted on one of a top major surface 12 and a spaced-apart rear major surface 14 of the display panel 10. More specifically, the main drive board 20 may be mounted on a rear surface of the display panel 10. In general, the display panel 10 displays a variable visual image on a top surface 12 of the display panel 10, and the other surface 14 of the display panel 10 cannot be viewed by a user. Therefore, in order to maximize space efficiency and to conceal a structure that is not necessarily viewed by the user, the main drive board 20 may be positioned on the rear major surface 14 of the display panel 10, which is, however, provided only for purpose of illustration. If necessary, the main drive board 20 can be positioned on a lateral surface of the display panel 10.

Since the main drive board 20 is a circuit board for supplying drive signals to the display panel 10, it is necessary to electrically connect the main drive board 20 to the display panel 10. Therefore, a component for electrically connecting the display panel 10 to the main drive board 20 is required, and the flexible circuit board 30 can be used as the electrically connecting component.

The flexible circuit board 30 is electrically connected to the display panel 10 and the main drive board 20, thereby providing an electrical connection between the display panel 10 and the main drive board 20. For example, a terminal end 36 of one side 31 of the flexible circuit board 30 is electrically connected to the display panel 10 and a terminal end 38 of the other side 35 of the flexible circuit board 30 is electrically connected to the main drive board 20, thereby allowing the display panel 10 and the main drive board 20 to be electrically connected to each other inside the flexible circuit board 30, that is, to be electrically connected between opposing inside extremities of the same major surface 31 of the flexible circuit board 30.

Although not shown, the flexible circuit board 30 may include a base film and a wire pattern positioned on the base film, when viewed on a cross section, and may further include a cover film positioned over the wire pattern.

The base film and the cover film may be made of a film material having good properties in view of flexibility, insulating property and heat resistance, for example, polyimide, but is not limited thereto.

The wire pattern may be positioned between the base film and the cover film. The wire pattern is provided for transmitting a predetermined electric signal and is made of a metal, such as copper (Cu). Alternatively, in (Sn), silver (Ag) or nickel (Ni) may be plated on a surface of copper (Cu). A method of forming the wire pattern may include casting, laminating, electroplating, and various other methods.

As described above, the end 36 of one side 31 of the flexible circuit board 30 may be electrically connected to one surface of the display panel 10 and the end 38 of the other side 35 of the flexible circuit board 30 may be electrically connected to the main drive board 20, in addition, an intermediate bent portion 33 may be formed along the lateral surface of the display panel 10 between one side 31 and the other side 35 of the flexible circuit board 30. That is to say, the flexible circuit board 30 is bent to surround the lateral surface of the display panel 10, the end 36 of one side 31 may be electrically connected to the display panel 10 and the end 38 of the other side 35 of the flexible circuit board 30 may be electrically connected to the main drive board 20.

Figure 2:
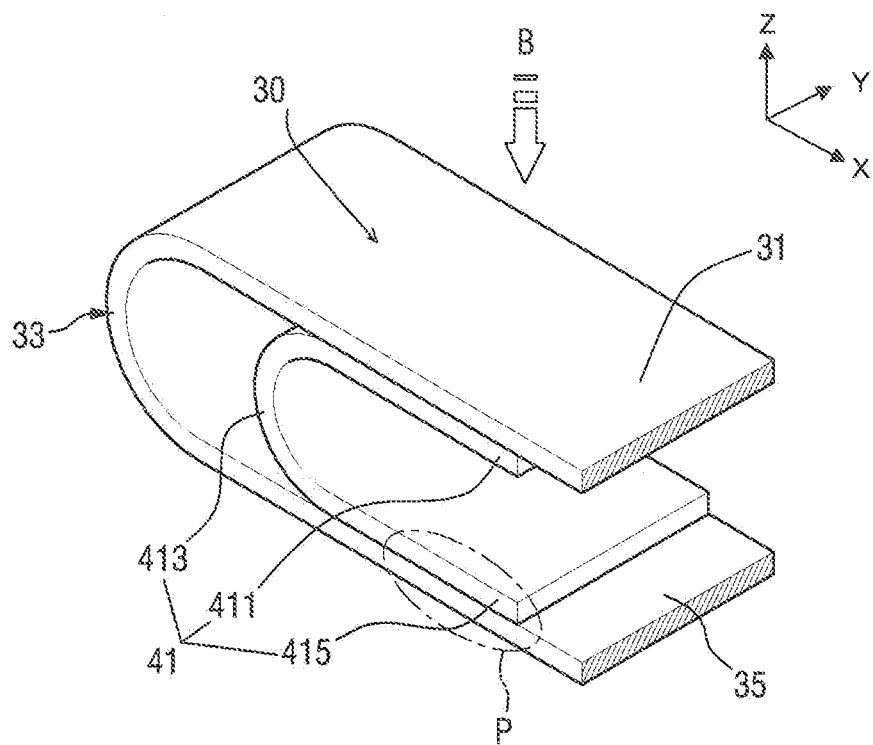
FIG. 2 is an enlarged oblique view illustrating a portion of the display device shown in FIG. 1, where a board support portion is formed.

A board support portion 41 for fixing and supporting the flexible circuit board 30 in its U-shape shown by FIGS. 1 and 2 may be formed on an inner surface of the flexible circuit board 30. For example, as shown, one end 411 of the board support portion 41 may be fixed to the inner surface of one side 31 of the flexible circuit board 30 and the other end 415 of the board support portion 41 may be fixed to the inner surface of the other side 35 of the flexible circuit board 30.

The board support portion 41 may be fixed to the inner surface of the flexible circuit board 30 in any method without limitation. The one end 411 and the other end 415 of the board support portion 41 may directly come into contact with the inner surface of the flexible circuit board 30 by thermal compression, for example, to then be fixed in position relative to the flexible circuit board 30. Alternatively, an adhesion layer or member may be formed between the one end 411 and the other end 415 of the board support portion 41 or between one inner surface and the other inner surface of the flexible circuit board 30. The board support portion 41 may be fixed to the flexible circuit board 30 by means of the adhesion member. For example, a double-sided adhesive tape or an adhesive resin may be used as the adhesion member, but not limited thereto. Alternatively, the one end 411 of the board support portion 41 may be fixed to the inner surface of the one side 31 of the flexible circuit board 30 by thermal compression and the other end 415 of the board support portion 41 may be fixed to the inner surface of the other side 35 of the flexible circuit board 30 by means of an adhesive resin, which will later be described in more detail with reference to FIG. 3.

Although FIG. 1 shows that the one end 411 of the board support portion 41, the other end 415 of the board support portion 41 and the lateral surface of the display panel 10 are spaced apart from each other, the one end 411 of the board support portion 41, the other end 415 of the board support portion 41 and the lateral surface of the display panel 10 may also contact each other by changing the relative spatial arrangement of the board support portion 41.

A board supporting bent portion 413 may be formed between the one end 411 and the other end 415 of the board support portion 41. As shown in FIG. 1, an outer surface of the board supporting bent portion 413 and the inner surface of the bent portion 33 of the flexible circuit board 30 may be spaced apart from each other. Although not shown, the outer surface of the board supporting bent portion 413 and the inner surface of the bent portion 33 of the flexible circuit board 30 may come into contact with each other. As shown in FIG. 1, a bent direction of the board supporting bent portion 413 is the same as a bent direction of the bent portion 33 of the flexible circuit board 30. Since the bent direction of the board supporting bent portion 413 is the same as that of the bent portion 33 of the flexible circuit board 30, interference between the flexible circuit board 30 and the display panel 10 can be suppressed even if the display panel 10 protrudes into a space in the board supporting bent portion 413.

According to this embodiment, as the board support portion 41 is formed on the inner surface of the flexible circuit board 30, deformation of the flexible circuit board 30 can be minimized by fixing the board support portion 41 thereto and suppressing interference between the flexible circuit board 30 and the display device 1. Accordingly, stress applied to the flexible circuit board 30 due to external factors or friction can be reduced, thereby lowering a possibility of damage occurring to the flexible circuit board 30. In addition, elastic restoration of the flexible circuit board 30 can be reduced, a possibility of internal damage occurring to the flexible circuit board, such as the flexible circuit board 30 becoming loose, can be minimized, thereby providing the display device 1 having improved reliability and durability.

FIG. 2 is an enlarged oblique view illustrating a portion of the display device shown in FIG. 1, where a board support portion is formed, specifically including the board support portion and the flexible circuit board of FIG. 1, and FIG. 3 is an enlarged cross-sectional view illustrating a portion of the board support portion forming portion (in XZ-plane) shown in FIG. 2, where the flexible circuit board is adhered to the board support portion, specifically a 'P' portion of FIG. 2.

Referring to FIG. 1 through FIGS. 3a and 3b, the one end 411 of the board support portion 41 may be adhered to the inner surface of one side 31 of the flexible circuit board 30 to then be fixed, and the other end 415 of the board support portion 41 may be fixed to the inner surface of the other side 35 of the flexible circuit board 30.

Figure 3A:
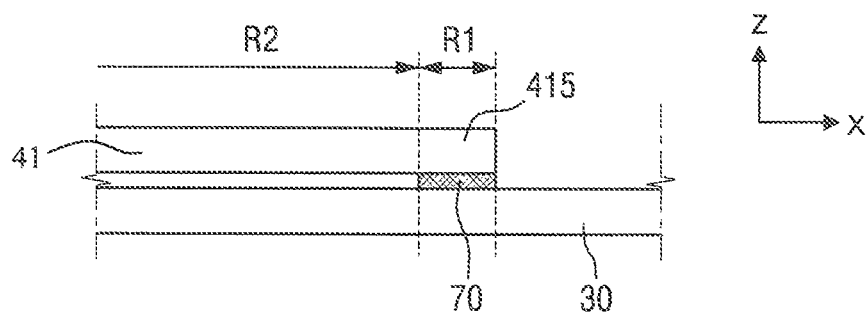
FIG. 3a is an enlarged cross-sectional view illustrating a portion of the board support portion forming portion shown in FIG. 2 according to an embodiment of the present invention, where a flexible circuit board is adhered to the board support portion.
Figure 3B:
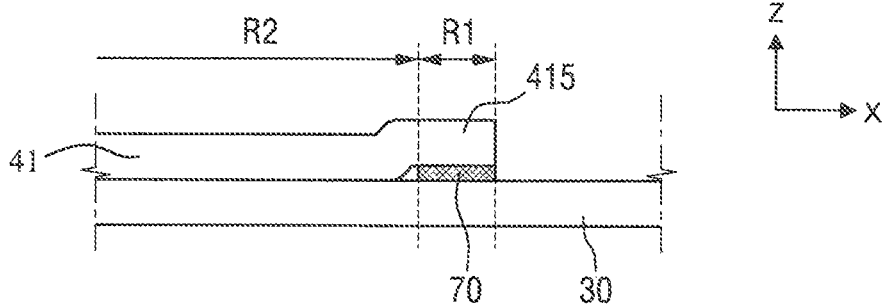
FIG. 3b is an enlarged cross-sectional view illustrating a portion of the board support portion forming portion shown in FIG. 2 according to another embodiment of the present invention, where a flexible circuit board is adhered to the board support portion.

Referring to FIGS. 3a and 3b, the board support portion 41 may include a first region R1 adhered to the flexible circuit board 30 and a second region R2 not adhered to the inner surface of the flexible circuit board 30. The first region R1 may be formed at the one end (411 of FIG. 2) and the other end (415 of FIG. 2) of the board support portion 41. That is to say, the board support portion 41 is adhered to the inner surface of the flexible circuit board 30 only at the first region R1 defined in the one end 411 and the other end 415, so that it can be fixed to the flexible circuit board 30. As shown in FIGS. 3a and 3b, the board support portion 41 and the flexible circuit board 30 are adhered to each other in the first region R1 by means of an adhesion member 70. In addition, although not shown, the one end 411 and the other end 415 of the board support portion 41 are thermally compressed to the inner surface of the flexible circuit board 30 in the first region R1 without separately providing the adhesion member 70, so that they can be fixed to the flexible circuit board 30.

The second region R2 of the board support portion 41 is a portion which is not adhered to the flexible circuit board 30, that is, a region excluding the first region R1. As shown in FIG. 3b, the board support portion 41 may come into contact with the flexible circuit board 30 in the second region R2. As shown in FIG. 3a, the board support portion 41 may be spaced apart from the flexible circuit board 30 in the second region R2. That is to say, as shown in FIG. 3b, the inner surface of the flexible circuit board 30 and the board support portion 41 may surface-contact with each other in the second region R2 in a state in which they are not fixed to each other. Accordingly, the flexible circuit board 30 may move due to its own flexibility. In addition, as shown in FIG. 3a, the inner surface of the flexible circuit board 30 and the board support portion 41 may be spaced apart from the board support portion 41 in the second region R2. Although not shown in FIGS. 3a and 3b, a portion of the inner surface of the flexible circuit board 30 comes into contact with the board support portion 41 in the second region R2, and the other portion of the inner surface of the flexible circuit board 30 may be spaced apart from the board support portion 41 in the second region R2.

As shown in FIGS. 1 and 2, the board supporting bent portion 413 may be formed between the one end 411 and the other end 415 of the board support portion 41. That is to say, the board support portion 41 may be bent by 180° such that the one end 411 of the board support portion 41 is parallel to the other end 415 of the board support portion 41, and the board supporting bent portion 413 may be formed between the one end 411 and the other end 415 of the board support portion 41. The board supporting bent portion 413 may be spaced apart from the bent portion 33 of the flexible circuit board 30. Although not shown, the board supporting bent portion 413 may come into contact with the bent portion 33 of the flexible circuit board 30, which is the same as described above in FIG. 1.

Figure 4:
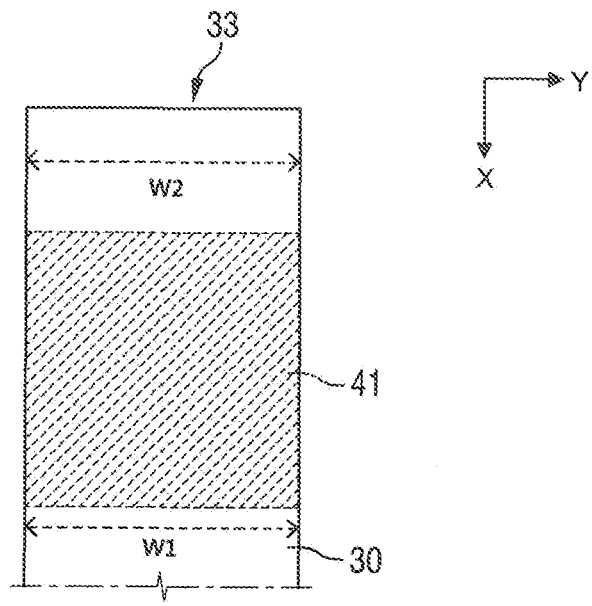
FIG. 4 is a plan view of the board support portion forming portion shown in FIG. 2.

FIG. 4 is a plan view of the board support portion forming portion shown in FIG. 2, specifically the board support portion forming portion viewed in a direction 'B' (or XY-plane) of FIG. 2. Referring to FIGS. 2 and 4, a plane of the board support portion 41 may have various shapes. For example, when the board support portion 41 is formed by bending a support member having a rectangular plane, the planar shape of the board support portion 41 may be a rectangle, as shown in FIG. 4, which is, however, provided only for illustration. The board support portion 41 may have various planar shapes, including a triangular shape, a pentagonal shape and other polygonal shapes, a semi-circular shape, a semi-spherical shape, an elliptical shape, and so on, according to the planar shape of the support member or the process of forming the board support portion 41.

Meanwhile, FIG. 4 shows that a width W1 of the board support portion 41 is equal to a width W2 of the flexible circuit board 30, but aspects of the present invention are not limited thereto. That is to say, the width W1 of the board support portion 41 may be smaller than or greater than the width W2 of the flexible circuit board 30.

Figure 5:
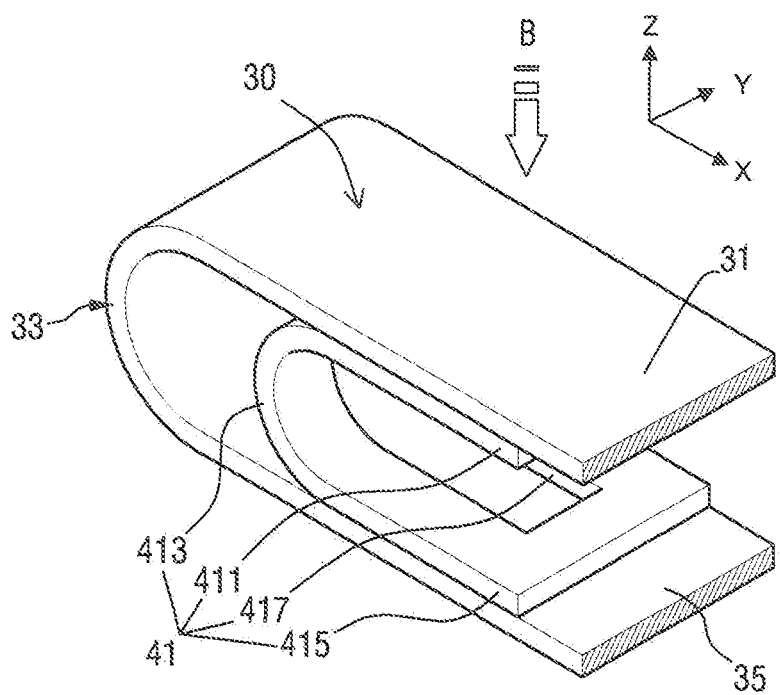
FIG. 5 is an enlarged oblique view illustrating a modified example of the board support portion forming portion shown in FIG. 2.
Figure 6:
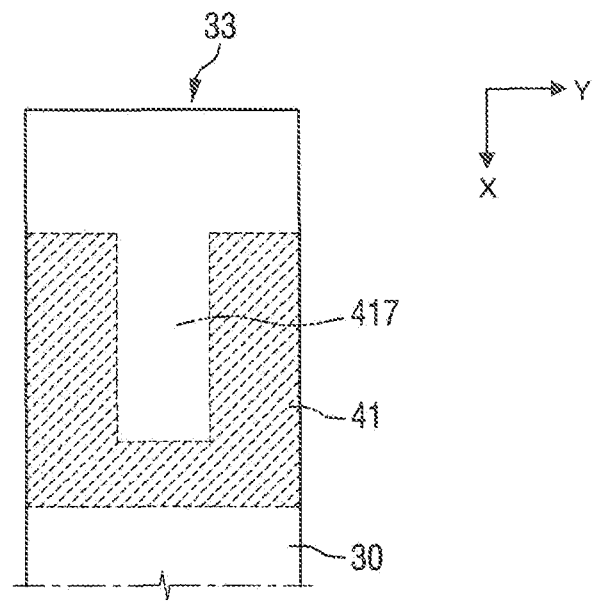
FIG. 6 is a plan view of the board support portion forming portion shown in FIG. 5.

FIG. 5 is an enlarged oblique view illustrating a modified example of the board support portion forming portion shown in FIG. 2, and FIG. 6 is a plan view of the board support portion forming portion shown in FIG. 5, specifically the board support portion forming portion viewed in a 'B' direction (or XY-plane) of FIG. 5.

Referring to FIGS. 2 to 6, the board support portion 41 may include openings 417, as shown in FIGS. 5 and 6. The present invention does not limit the number of openings 417. For example, as shown in FIGS. 5 and 6, a single opening 417 may be formed in the board support portion 41. Alternatively, a plurality of openings 417 may also be formed in the board support portion 41.

In addition, the present invention does not limit the location of the opening 417 formed. For example, the opening 417 may be formed in the second region (R2 of FIG. 3), but aspects of the present invention are not limited thereto. The opening 417 may be formed in the first region (R1 of FIG. 3) unless adhesion between the board support portion 41 and the flexible circuit board 30 is interfered.

In addition, the present invention does not limit the range of the opening 417 formed. For example, as shown in FIGS. 5 and 6, the opening 417 may be formed to extend to the board supporting bent portion 413, but aspects of the present invention are not limited thereto. If necessary, the range may be controlled.

The planar shape of the opening 417 may take any shape without limitation. For example, as shown in FIG. 6, the planar shape of the opening 417 may be a rectangle, but aspects of the present invention are not limited thereto. Rather, the opening 417 may have various shapes, including a triangular shape, a pentagonal shape and other polygonal shapes, a semi-circular shape, a semi-spherical shape, an elliptical shape, and so on. The other components are the same as those shown in FIGS. 1 to 4 and a detailed description thereof will be omitted.

As described above, since the opening 417 is formed in the board support portion 41, the effect of saving the raw material cost of the board support portion 41 can be additionally achieved, in addition to the effects described above in FIGS. 1 to 4.

Figure 7:
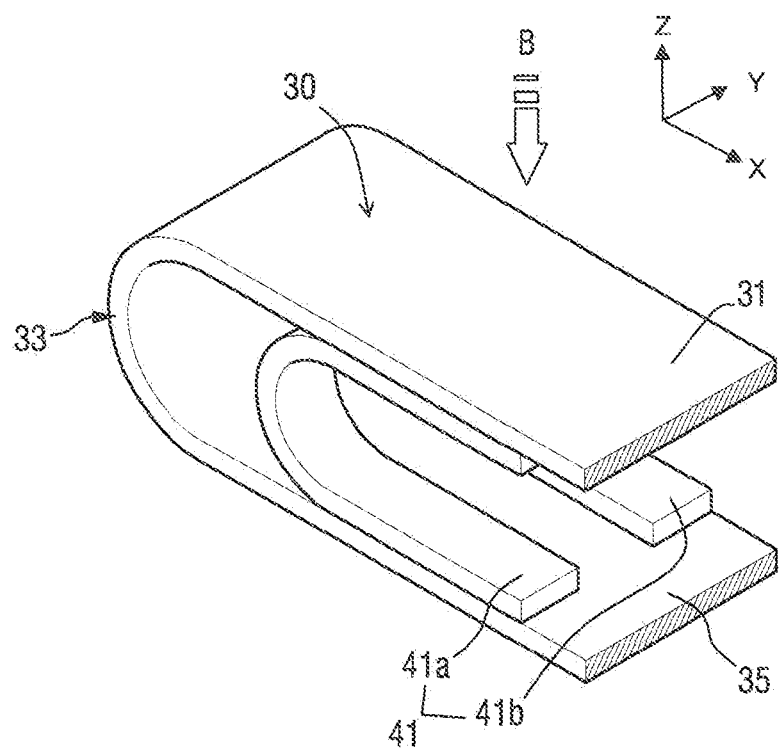
FIG. 7 is an enlarged oblique view illustrating another modified example of the board support portion forming portion shown in FIG. 2.
Figure 8:
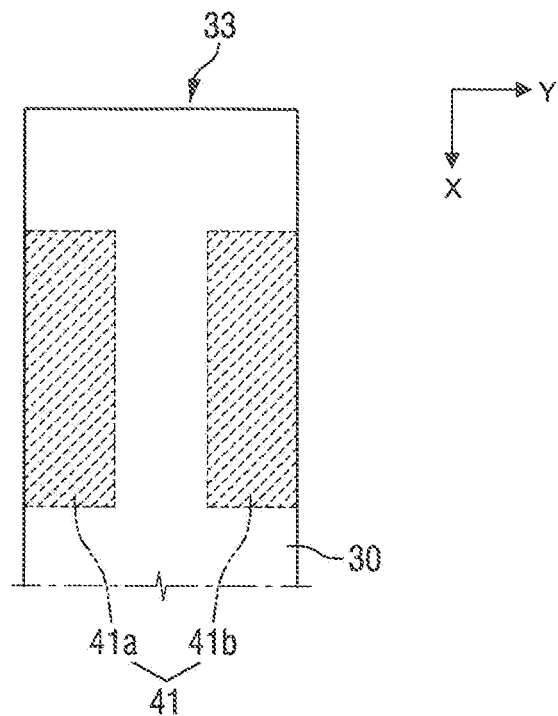
FIG. 8 is a plan view of the board support portion forming portion shown in FIG. 7.

FIG. 7 is an enlarged oblique view illustrating another modified example of the board support portion forming portion shown in FIG. 2, and FIG. 8 is a plan view of the board support portion forming portion shown in FIG. 7, specifically the board support portion forming portion viewed in a 'B' direction for XY-plane) of FIG. 7.

Referring to FIGS. 2 to 4 and FIGS. 7 and 8, the board support portion 41 according to the embodiment of the present invention may include a plurality of sub support portions.

The present invention does not limit the number of sub support portions formed. For example, as shown in FIGS. 7 and 8, the board support portion 41 may include two sub support portions, that is, a first sub support portion 41a and a second sub support portion 41b. Alternatively, the board support portion 41 may include three or more sub support portions.

The present invention does not limit the relative arrangement of the plurality of sub support portions 41a and 41b. For example, when the board support portion 41 includes the first sub support portion 41a and the second sub support portion 41b, the first sub support portion 41a and the second sub support portion 41b may be spaced apart from each other to be parallel with each other, as shown in FIGS. 7 and 8. In addition, although not shown, the first sub support portion 41a and the second sub support portion 41b may be arranged to alternate with each other.

The present invention does not limit the planar shapes of the respective sub support portions 41a and 41b. For example, as shown in FIG. 8, the planar shapes of the respective sub support portions 41a and 41b may be rectangles, but not limited thereto. Each of the sub support portions 41a and 41b may have various planar shapes, including a triangular shape, a pentagonal shape and other polygonal shapes, a semi-circular shape, a semi-spherical shape, an elliptical shape, and so on. The other components are the same as those shown in FIGS. 1 to 4 and a detailed description thereof will be omitted.

As described above, since the board support portion 41 includes a plurality of sub support portions 41a and 41b, the effect of saving the raw material cost of the board support portion 41 can be additionally achieved, in addition to the effects described above in FIGS. 1 to 4.

Figure 9:
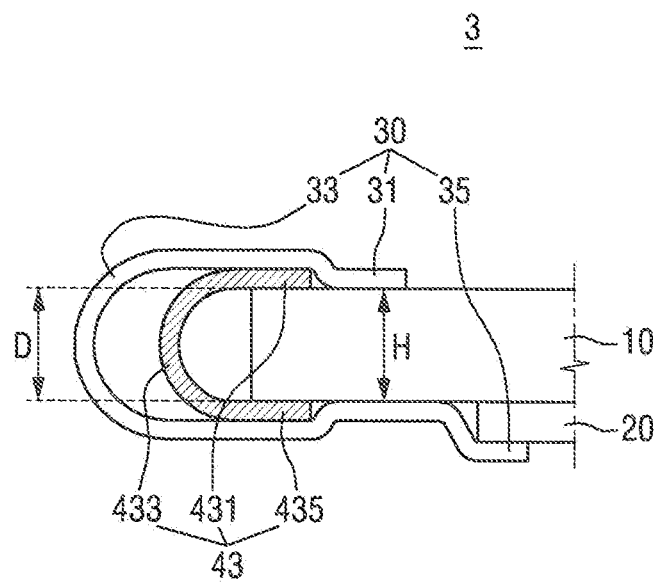
FIG. 9 is a cross-sectional view of a display device according to another embodiment of the present invention.

FIG. 9 is a cross-sectional view of a display device according to another embodiment of the present invention.

The display device 3 according to another embodiment of the present invention is different from the display device 1 shown in FIG. 1 in that one and the other ends of a board support portion overlap one and the other surfaces of a display panel, which is the same as described above in FIG. 1.

Referring to FIGS. 1 and 9, the display device 3 may be configured such that one end 431 of a board support portion 43 is positioned on one surface of the display panel 10 to overlap the display panel 10. That is to say, the one end 431 of the board support portion 43 may be positioned such that edges of one surface of the display panel 10 are surrounded by the one end 431 of the board support portion 43. Likewise, the other end 435 of the board support portion 43 may be positioned on the other surface of the display panel 10 to overlap the display panel 10. That is to say, the other end 435 of the board support portion 43 may be positioned such that edges of the other surface of the display panel 10 are end surrounded by the other end 435 of the board support portion 43. That is to say, the board support portion 43 may be configured such that a width D ranging from a bottom surface of the one end 431 to a top surface of the other end 435 is equal or greater than a thickness H of the display panel 10. Accordingly, the ends 431 and 435 of the board support portion 43 may surround the edges of the display panel 10. In addition, although not shown, only one of the one end 431 and the other end 435 of the board support portion 43 may surround the edges of the display panel 10.

The other components of the board support portion 43 are the same as those of the board support portion 41 described above with reference to FIGS. 1 to 5, and repeated descriptions thereof will be omitted. In addition, the board support portion 43 can be modified variously in the same manner as the board support portion 41 described above with reference to FIGS. 5 to 8, and repeated descriptions thereof will be omitted.

According to this embodiment, the effect of reducing the stress applied to the flexible circuit board 30 from the edges of the display panel 10 can be additionally achieved, in addition to the effects described above in FIGS. 1 to 4. Accordingly, the effect of preventing disconnection or damages of the flexible circuit board 30 can be additionally achieved.

Figure 10:
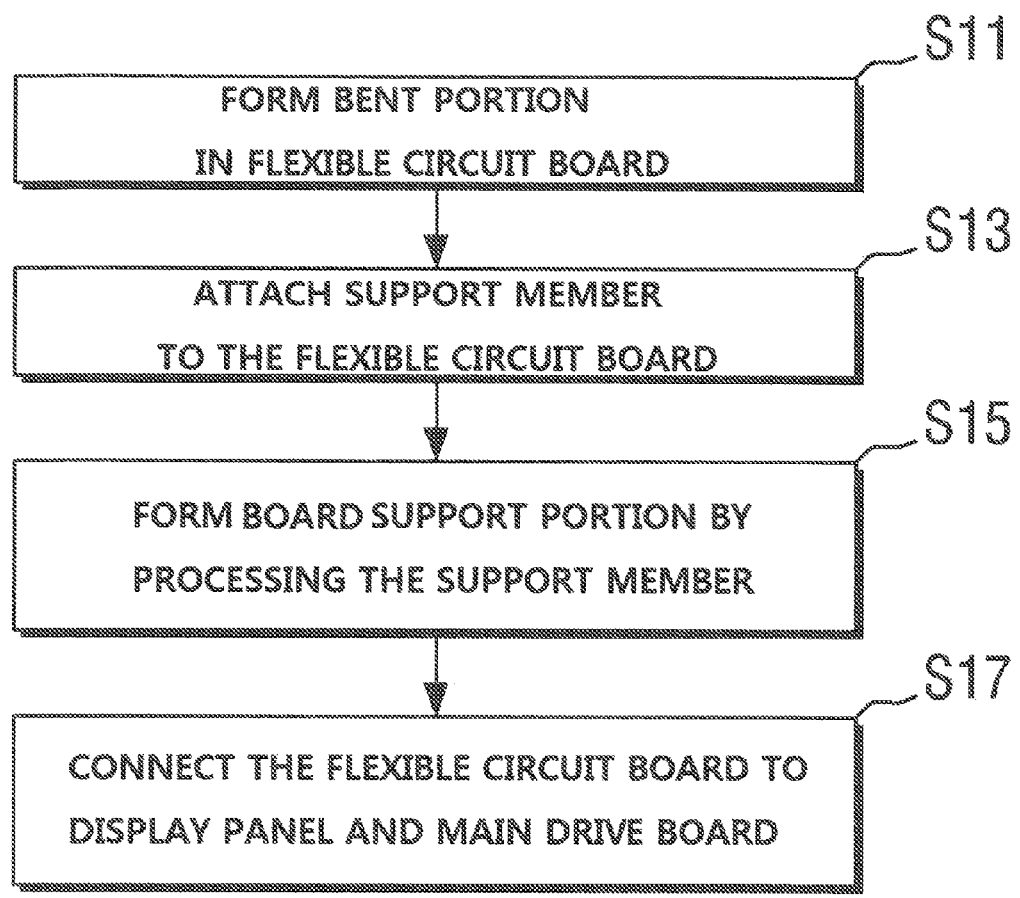
FIG. 10 is a flowchart illustrating a method of manufacturing a display device according to an embodiment of the present invention.
Figure 11:
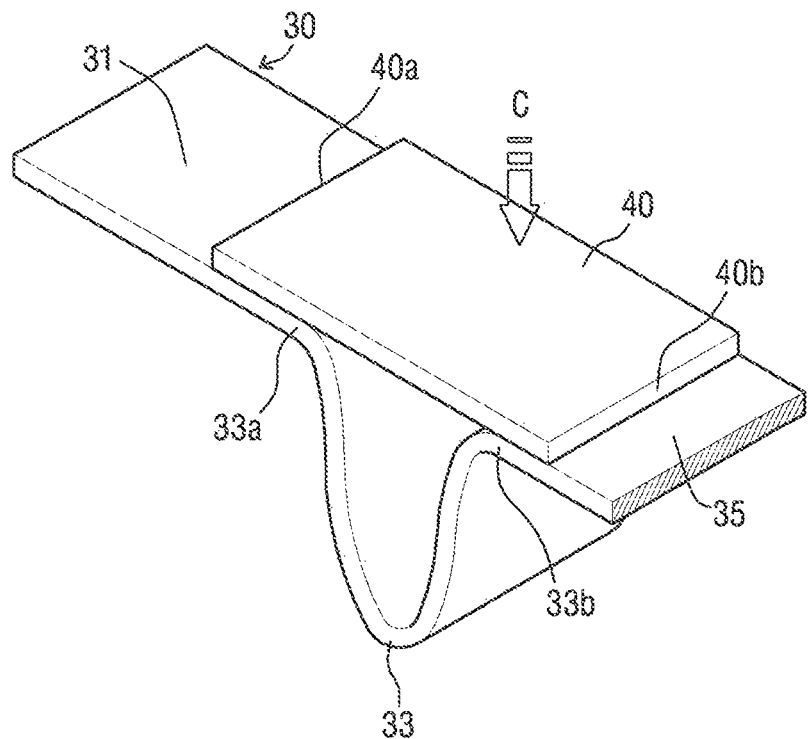
FIGS. 11 and 12 are oblique views illustrating process steps of the method of manufacturing a display device according to an embodiment of the present invention.
Figure 12:
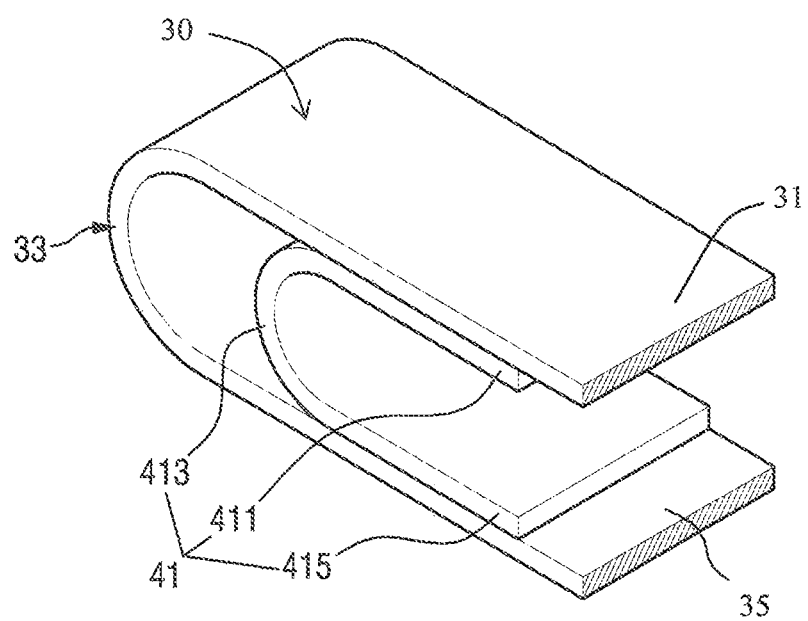

FIG. 10 is a flowchart illustrating a method of manufacturing a display device according to an embodiment of the present invention and FIGS. 11 and 12 are oblique views illustrating process steps of the method of manufacturing a display device according to an embodiment of the present invention.

The following description will be made with regard to a case of manufacturing the display device (1 of FIG. 1) by way of example. However, the same method of manufacturing the display device according to an embodiment of the present invention can also be used in manufacturing the display device 3 shown in FIG. 9.

Referring to FIGS. 10 to 12, the manufacturing method of the display device according to the embodiment of the present invention may include forming a bent portion on a flexible circuit board (S11), attaching a support member to the flexible circuit board having the bent portion (S13), forming a board support portion by processing the support member (S15), and electrically connecting the flexible circuit board to a display panel and a main drive board (S17).

The forming of the bent portion to the flexible circuit board (S11) and the attaching of the support member to the flexible circuit board (S13) are performed as follows.

As shown in FIG. 11, a portion of the flexible circuit board 30 is bent to form a bent portion 33. Here, one side 31 and the other side 35 of the flexible circuit board 30 may be at a state in which they are not bent. That is to say, the one side 31 and the other side 35 of the flexible circuit board 30 may be at a state in which they exist on the same plane.

Thereafter, the support member 40 may be attaching to the flexible circuit board 30. That is to say, as shown in FIG. 11, one end 40a of the support member 40 may be adhered to one side 33a of the bent portion 33 of the one side 31 of the flexible circuit board 30, and the other end 40b of the support member 40 may be adhered to the other side 33b of the bent portion 33 of the other side 35 of the flexible circuit board 30. The adhering of the support member 40 may be performed by means of an adhesion member, such as an adhesive tape. The support member 40 may be thermally compressed on the flexible circuit board 30. The present invention does not limit the material of the support member 40. The support member 40 may include a thermally curable resin or a photo-curable resin that is well known in the art, and may further include a thermally shrinkable material.

Thereafter, a board support portion may be formed by processing the support member (40 of FIG. 11). First, a force is applied to the support member 40 in a 'C' direction shown in FIG. 11 to bend the support member 40. Here, the force applied to the support member 40 may be externally applied using a tool. Alternatively, the force applied to the support member 40 may be a thermally shrinking force of the support member 40. The flexible circuit board 30 is fixed to one side 40a and the other side 40b of the support member 40. The one side 31 of the flexible circuit board 30 may be upwardly bent by the force applied to the support member 40, and the other side 35 of the flexible circuit board 30 may also be upwardly bent.

Accordingly, as shown in FIG. 12, a board support portion 41 may be formed inside the flexible circuit board 30 by deforming the support member 40 with an external force. More specifically, the board support portion 41 may be formed in a U-shape. The board support portion 41, however, may have various other shapes. The flexible circuit board 30 may be bent such that the one side 31 and the other side 35 of the flexible circuit board 30 are parallel with each other, and the bent portion 33 may be formed between the one side 31 and the other side 35 of the flexible circuit board 30. In addition, the board support portion 41 formed by processing the support member (40 of FIG. 11) may be formed on the inner surface of the flexible circuit board 30, and the board supporting bent portion 413 may be formed on the board support portion 41.

Thereafter, as shown in FIG. 1, the end of one side 31 of the flexible circuit board 30 may be electrically connected to the display panel (10 of FIG. 1) and the end of the other side 35 of the flexible circuit board 30 may be electrically connected to the main drive board 20, thereby manufacturing the display device (1 of FIG. 1). In addition, as shown in FIG. 9, while the flexible circuit board 30, the display panel (10 of FIG. 9) and the main drive board (20 of FIG. 9) are electrically connected, one of the one end 431 and the other end 435 of the board support portion 43 may overlap one of one and the other surfaces of the display panel (10 of FIG. 9).

Figure 13:
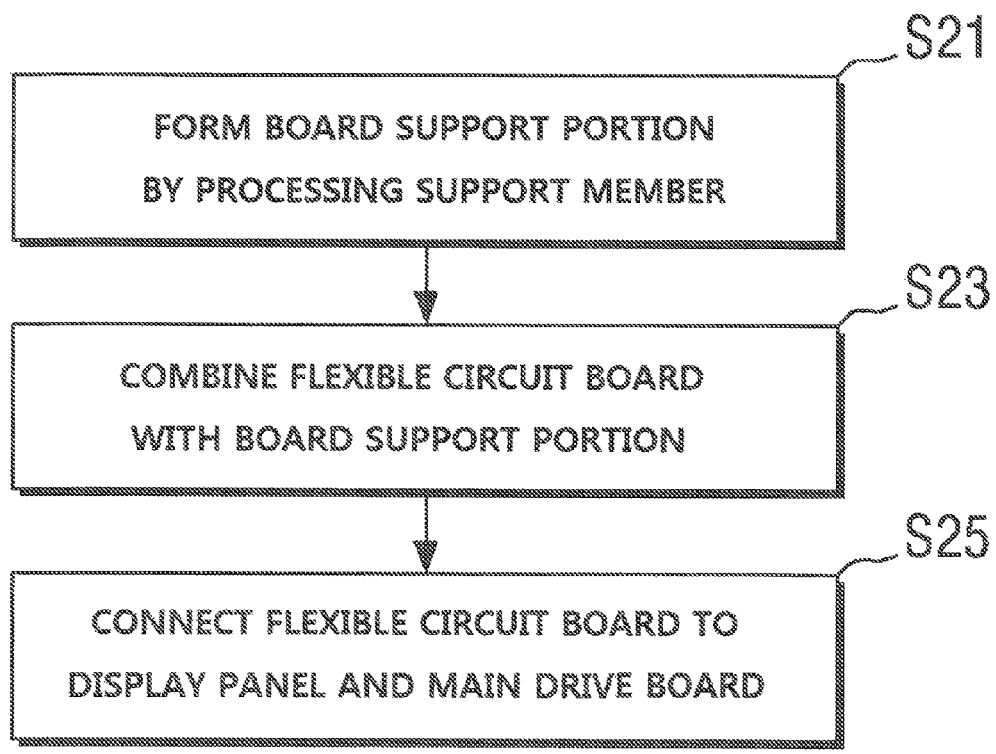
FIG. 13 is a flowchart illustrating a method of manufacturing a display device according to another embodiment of the present invention.
Figure 14:
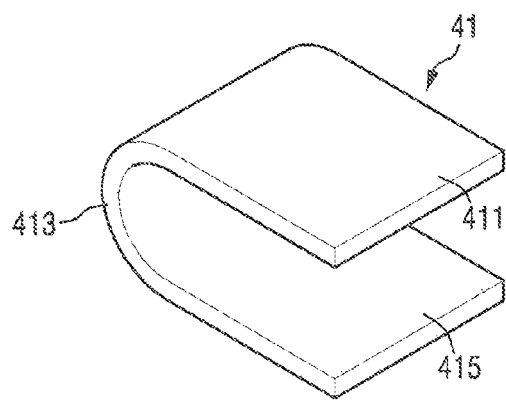
FIGS. 14 to 16 are oblique views illustrating process steps of the method of manufacturing a display device according to another embodiment of the present invention.
Figure 15:
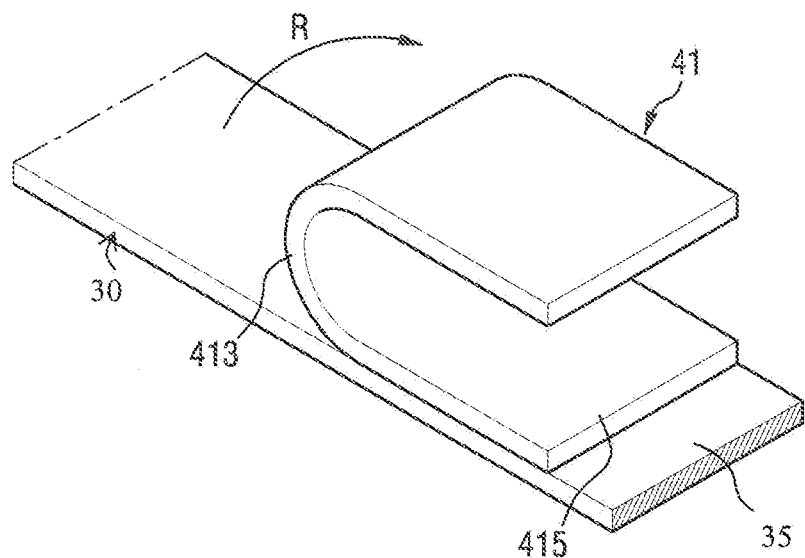
Figure 16:
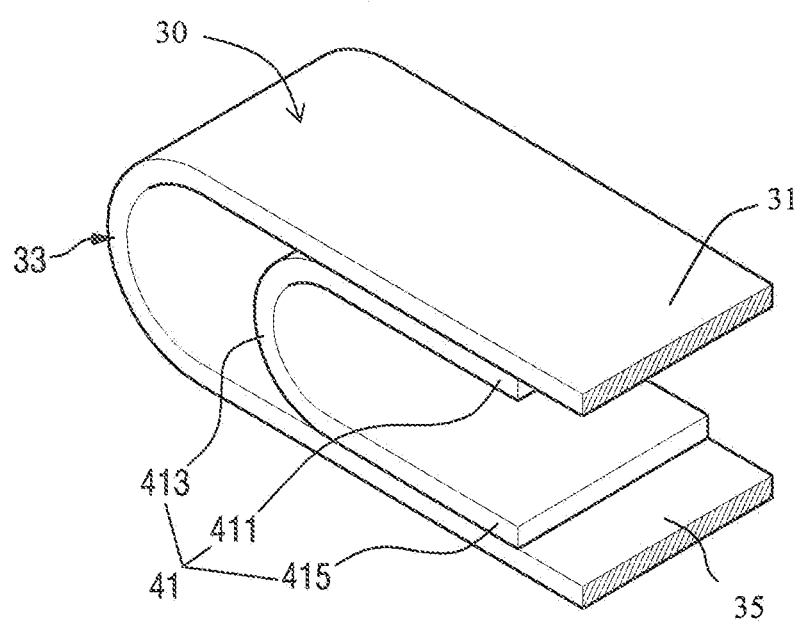

FIG. 13 is a flowchart illustrating a method of manufacturing a display device according to another embodiment of the present invention, and FIGS. 14 to 16 are oblique views illustrating process steps of the method of manufacturing a display device according to another embodiment of the present invention. The following description will be made with regard to a case of manufacturing the display device (1 of FIG. 1) by way of example. However, the same method of manufacturing the display device according to another embodiment of the present invention can also be used in manufacturing the display device 3 shown in FIG. 9.

Referring to FIGS. 13 to 16, the manufacturing method of the display device according to the embodiment of the present invention may include forming a board support portion by processing a support member (S21), attaching the board support portion to a flexible circuit board (S23), and electrically connecting the flexible circuit board to a display panel and a main drive board (S25).

The forming of the board support portion by processing the support member (S21) and the attaching of the board support portion to the flexible circuit board (S23) are performed as follows.

As shown in FIG. 14, the board support portion 41 is formed by processing the support member. The board support portion 41 may be arranged such that one end 411 and the other end 415 of the board support portion 41 are parallel with each other, and a board supporting bent portion 413 may be formed between the one end 411 and the other end 415 of the board support portion 41. More specifically, the board support portion 41 may be formed in U-shape. The board support portion 41, however, may have various other shapes. The present invention does not limit the manner of forming the board support portion. For example, the board support portion may be formed by bending a plate-shaped support member, but aspects of the present invention are not limited thereto. Rather, the board support portion may be formed by injection molding using a mold. The other components of the board support portion 41 are the same as those shown in FIG. 1 and a detailed description thereof will be omitted.

Thereafter, as shown in FIG. 15, the other end 415 of the board support portion 41 may be fixed to the other side of the flexible circuit board 30. Here, the fixing of the other end 415 of the board support portion 41 to the other side of the flexible circuit board 30 may performed by means of the adhesion member. Alternatively, the other end 415 of the board support portion 41 may be thermally compressed on the flexible circuit board 30.

After the other end 415 of the board support portion 41 is fixed to the other side of the flexible circuit board 30, one side of the flexible circuit board 30 is bent in an 'R' direction to be fixed to the one end 411 of the board support portion 41, thereby manufacturing the structure shown in FIG. 16.

Thereafter, as shown in FIG. 1, the end of one side 31 of the flexible circuit board 30 is electrically connected to the display panel (10 of FIG. 9) and the end of the other side 35 of the flexible circuit board 30 is electrically connected to the main drive board (20 of FIG. 10), thereby manufacturing the display device (1 of FIG. 1). In addition, as shown in FIG. 9, while the flexible circuit board 30, the display panel (10 of FIG. 9) and the main drive board (20 of FIG. 10) are electrically connected to each other, one of the one end 431 and the other end 435 of the board support portion 43 may overlap one of one and the other surfaces of the display panel (10 of FIG. 9).

As described above, the display device according to the embodiments of the present invention can prevent deformation of a flexible circuit board, prevent interference and friction between a display panel and a flexible circuit board, and can prevent the flexible circuit board from getting loose thereby improving the reliability and durability of the display device.

While the present invention has been particularly shown and described with reference to exemplary embodiments thereof, it will be understood by those of ordinary skill in the art that various changes in form and details may be made therein without departing from the spirit and scope of the present invention as defined by the following claims. It is therefore desired that the present embodiments be considered in all respects as illustrative and not restrictive, reference being made to the appended claims rather than the foregoing description to indicate the scope of the invention.

What is claimed is:

1. A display device, comprising:
   a display panel having spaced-apart first and second surfaces and a lateral surface connecting the first and second surfaces;
   a main drive board disposed on the second surface of the display panel;
   a flexible circuit board including
      one terminal end electrically connected to the first surface of the display panel and
      an opposite terminal end electrically connected to the main drive board, and including
      a bent portion formed adjacent to the lateral surface of the display panel; and
   a board support portion disposed on an inner major surface of the flexible circuit board, including
      a first region attached to the inner major surface of the flexible circuit board,
      a second region not attached to the inner surface of the flexible circuit board and
      a board supporting bent portion formed between first and second ends of the board support portion,
      wherein a major inner surface of the bent portion of the flexible circuit board and a major outer surface of the board supporting bent portion is spaced apart from each other.

2. The display device of claim 1 wherein the first region is formed at one and another ends of the board support portion.

3. The display device of claim 2, wherein at least one of the one and another ends of the board support portion overlaps at least one of the first and second surfaces of the display panel.

4. The display device of claim 1, wherein the first region of the board support portion is attached to the major inner surface of the flexible circuit board by means of an adhesion member.

5. The display device of claim 1, wherein the first region of the board support portion is directly attached to the inner surface of the flexible circuit board by thermal compression.

6. The display device of claim 1, wherein a bent direction of the bent portion of the flexible circuit board is the same as a bent direction of the board supporting bent portion.

7. The display device of claim 1, wherein a width ranging from an inner surface of one end of the board support portion to an inner surface of the other end of the board support portion is equal or greater than a thickness of the display panel.

8. A display device, comprising:
   a display panel having spaced-apart first and second surfaces and a lateral surface connecting the first and second surfaces;
   a main drive board disposed on the second surface of the display panel;
   a flexible circuit board including one terminal end electrically connected to the first surface of the display panel and an opposite terminal end electrically connected to the main drive board, and including a bent portion formed adjacent to the lateral surface of the display panel; and
   a board support portion disposed on an inner major surface of the flexible circuit board, including a first region attached to the inner major surface of the flexible circuit board, a second region not attached to the inner surface of the flexible circuit board, wherein the board support portion includes a plurality of sub support portions.

9. A display device, comprising:
   a display panel having spaced-apart first and second surfaces and a lateral surface connecting the first and second surfaces;
   a main drive board disposed on the second surface of the display panel;
   a flexible circuit board including one terminal end electrically connected to the first surface of the display panel and an opposite terminal end electrically connected to the main drive board, and including a bent portion formed adjacent to the lateral surface of the display panel; and
   a board support portion disposed on an inner major surface of the flexible circuit board, including a first region attached to the inner major surface of the flexible circuit board, a second region not attached to the inner surface of the flexible circuit board, wherein the board support portion includes one or more openings.

* * * * *